Sept. 24, 1968 W. R. KOCH 3,403,361

POTENTIOMETER FREQUENCY ADJUSTMENT OF A TUNED CIRCUIT

Filed May 16, 1966

INVENTOR.
WINFIELD R. KOCH

BY H. H. Losche
ATT'YS.

3,403,361
POTENTIOMETER FREQUENCY ADJUSTMENT OF A TUNED CIRCUIT

Winfield R. Koch, Marlton, N.J., assignor, by mesne assignments, to the United States of America as represented by the Secretary of the Navy Filed May 16, 1966, Ser. No. 551,497
1 Claim. (Cl. 334—40)

ABSTRACT OF THE DISCLOSURE

A network coupled in a tuned circuit for trimmer adjustment of same having a potentiometer and a capacitor arranged in the coupling of the tuned circuit with an amplifier for trimming the reactance to compensate for changes in the resonant frequency from a predetermined amount.

*Background of the invention*

This invention relates to a trimming adjustment for tuned circuits and more particularly to a potentiometer and capacitor network in a tuned circuit coupled to an amplifier for trimming the resonant frequency to maintain a constant predetermined frequency.

In radio signaling equipment, means are necessary in the tuned circuits and stagger-tuned circuits therefor to trim the reactance to maintain a predetermined resonance. These trimmers are necessary to compensate for changes in circuit parameters or drift in circuit constants which tend to cause the resonant frequency to drift from its preset or established value. At low frequencies trimming elements, usually variable inductance or variable capacitance elements, become very large. Tight tolerance on components of the tuned circuit make them very expensive.

*Summary of the invention*

In the present invention a potentiometer is used in conjunction with a capacitor to adjustably trim a tuned resonant circuit. The potentiometer is small and inexpensive and used to vary the resistance of the resistance-capacitance (RC) component to provide trimming adjustment of the resonant circuit without changing substantially the loaded Q between the extreme adjustment positions of the potentiometer. An added capacitor, in one modification, would be larger than the capacitor of the tuned circuit when the potentiometer resistance is coupled in parallel to the added capacitor but does not need close tolerance. In another modification the added capacitor can be smaller than the capacitor of the tuned circuit when the potentiometer resistance is coupled between the collector and base of an amplifier transistor amplifying the resonant frequency signals, such as audio signals. It is therefore a general object of this invention to provide a tuned circuit amplifier with a potentiometer trimming adjustment to maintain a constant resonant frequency without substantial change in the loaded Q throughout the full range of adjustment.

*Brief description of the drawing*

These and other objects and the attendant advantages, features, and uses will become more apparent to those skilled in the art as a more detailed description proceeds when considered along with the accompanying drawing, in which.

*Description of the preferred embodiments*

Figure 1:
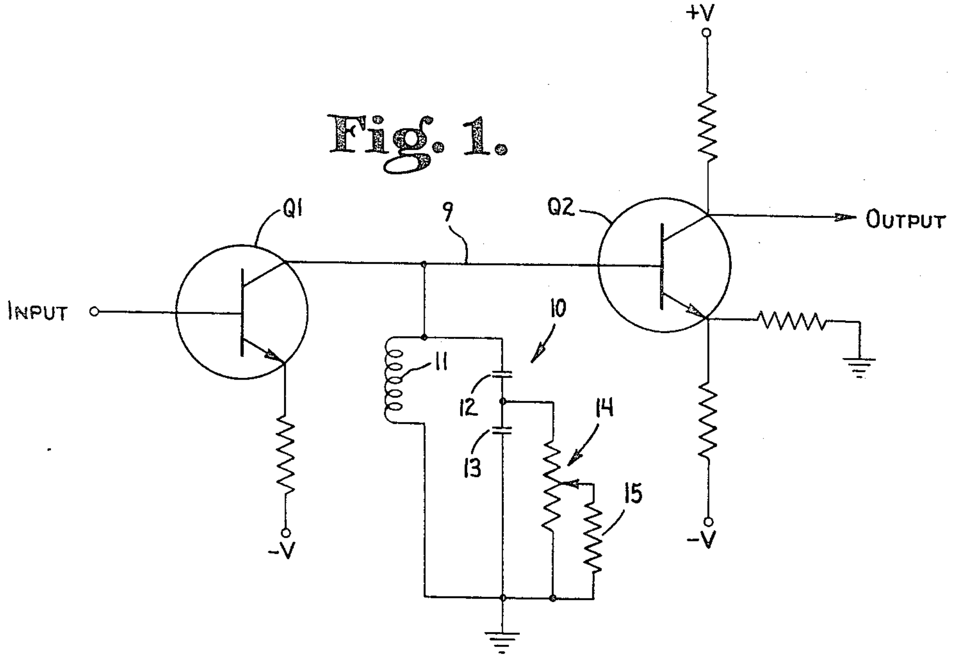
FIGURE 1 is a circuit schematic of one embodiment of the adjustable tuned circuit of this invention.

Referring more particularly to FIGURE 1 an amplifier utilizing two stages of transistors Q1 and Q2 is shown with the collector of Q1 being coupled by 9 directly to the base of Q2 with base, emitter, and collector voltages supplied, as is well understood by those skilled in the amplifier art. The input to the amplifier is on the base of transistor Q1 while the output is taken from the collector of transistor Q2 in which the output voltage is developed across a collector load resistor. The amplifier of two stages Q1 and Q2 is designed to amplify a predetermined frequency permitted by the tuned circuit 10 having an inductance 11 and a capacitance 12 connected between the first-mentioned coupling 9 and a fixed potential such as ground. The collector of Q1 and the base of Q2 are biased through the inductance 11 from the ground potential. The elements 11 and 12 ordinarily provide a tuned circuit having a resonant frequency of the frequency to be amplified by Q1 and Q2. In accordance with this invention a capacitor 13, which is much larger than capacitor 12, is coupled in series with capacitor 12 between the coupling 9 and the fixed potential. In parallel with this large capacitor 13 is the resistance element of a potentiometer 14 having the adjustable tap thereof coupled through a resistance 15 to the fixed potential. The resistance element of the potentiometer 14 is of such value as to give the circuit the desired loaded Q with the adjustable tap of the potentiometer at the ground end, or the highest resonant frequency. The resistor 15, connected between the adjustable tap of the potentiometer 14 and ground, is of such value as to give the desired loaded Q when the adjustable tap is at the top end of the potentiometer providing the lowest resonant frequency. By this relation of values capacitor 13 need not be of close tolerance and the coil 11 and capacitor 12 need only be of moderately tight tolerance in the original tuned circuit. Potentiometer 14 need not be a high precision potentiometer to provide trim of the tuned circuit 10. Potentiometer 14 permits adjustment of the resonant frequency of the tuned circuit 10 with an insignificant change in the loaded Q of the circuit. This is a distinct advantage and a large saving in size and cost at low frequency operation where tuned circuit elements are usually of large size.

Figure 2:
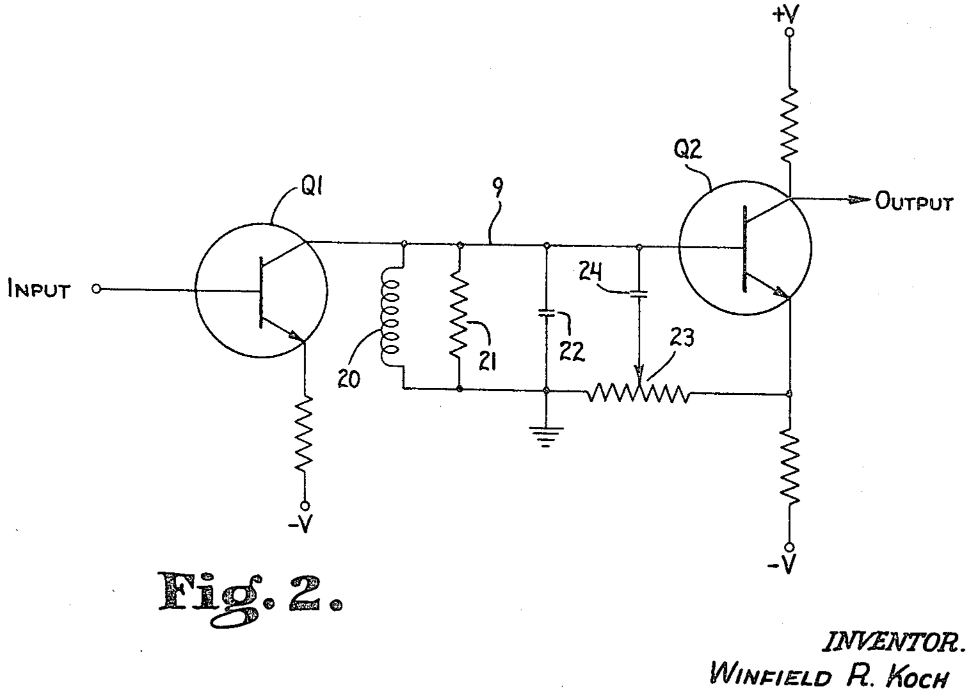
FIGURE 2 is a circuit schematic of another embodiment of the adjustable tuned circuit of this invention.

Referring more particularly to FIGURE 2, where like reference characters identify like parts in FIGURE 1, the original tuned circuits herein comprises the inductance 20, resistance 21, and capacitor 22 coupled between the collector-base coupling 9 and the fixed or ground potential. In this figure, as in FIGURE 1, direct current collector bias for transistor Q1 and base bias for transistor Q2 is provided through the inductance coil 20. In this modification the potentiometer 23, similar to the potentiometer 14 in FIGURE 1, has its resistance element coupled between the emitter of transistor Q2 supplied by a negative voltage and fixed potential such as ground. The adjustable tap of potentiometer 23 is coupled to one plate of a capacitor 24, the opposite plate of which is coupled to the collector-to-base coupling 9. The capacitor 24 in this modification is much smaller than capacitor 22. The resistance of the potentiometer relative to the collector load resistor determines the voltage gain on the amplifier and a fairly low value of resistance can be used. It can be seen that with the adjustable tap of potentiometer 23 at the fixed potential or ground end of the resistance, capacitor 24 is in parallel with capacitor 22 and the resonant frequency will be at its lowest value. With the adjustable tap of potentiometer 23 at the emitter end, since the emitter voltage is practically at the same alternating current voltage as the base thereof to which the upper end of the capacitor 24 is connected, very little current will flow through capacitor 24 and the frequency will be about the same as if capacitor 24 were disconnected. In this position of the potentiometer 23 the resonant frequency will be at its highest trimmed value. With the adjustable tap of the potentiometer 23 at intermediate points a small amount of resistance is introduced into the circuit but this is small compared to the reactance of the capacitor 24 and therefore changes the loaded Q of the circuit very little.

As may be seen in both FIGURES 1 and 2 in the operation of the two embodiments of the device, the elements 11 and 12 in FIGURE 1 and the elements 20, 21, and 22 in FIGURE 2 establish the CR circuit constant for the tuning or resonant circuit 10 of the signal frequency to be amplified. Where it is necessary to trim out a slight drift in this resonant frequency up or down the adjustable tap of the potentiometer 14 or 23 provides means to readjust the resonant frequency to its predetermined value without any appreciable change in the loaded Q of the circuit.

While many modifications and changes may be made in the constructional details and features of this invention without departing from the spirit of its intended purposes, as by utilizing the invention with a vacuum tube amplifier, it is to be understood that I desire to be limited in the scope of my invention only by the limits of the appended claim.

I claim:

1. A frequency trimming adjustment of a tuned circuit comprising:

a tuned circuit consisting of an inductance, a resistance, and a first capacitor in parallel with one end of said parallel circuit coupled to a fixed potential; and a potentiometer having its resistance element coupled between said fixed potential and a voltage source and having its adjustable tap coupled to one plate of a second capacitor, the opposite plate thereof being coupled to the other end of said parallel circuit.

References Cited

UNITED STATES PATENTS

| | | | |
|---|---|---|---|
| 1,778,827 | 10/1930 | Evans | 331—177 X |
| 2,082,587 | 6/1937 | Meinema | 334—40 |

FOREIGN PATENTS

| | | |
|---|---|---|
| 653,116 | 5/1951 | Great Britain. |

OTHER REFERENCES

Paasch, "Resistance Tuning," Radio Craft, January 1937, p. 411.

ROY LAKE, *Primary Examiner.*

JAMES B. MULLINS, *Assistant Examiner.*